(12) United States Patent
Katsuhara et al.

(10) Patent No.: US 12,078,561 B2
(45) Date of Patent: Sep. 3, 2024

(54) OPTICAL SENSOR AND OPTICAL SENSOR MODULE

(71) Applicants: SONY GROUP CORPORATION, Tokyo (JP); SONY SEMICONDUCTOR SOLUTIONS CORPORATION, Kanagawa (JP)

(72) Inventors: Tomoko Katsuhara, Tokyo (JP); Hiizu Ohtorii, Kanagawa (JP); Kei Tsukamoto, Tokyo (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 187 days.

(21) Appl. No.: 17/772,053

(22) PCT Filed: Oct. 12, 2020

(86) PCT No.: PCT/JP2020/038452
§ 371 (c)(1),
(2) Date: Apr. 26, 2022

(87) PCT Pub. No.: WO2021/085098
PCT Pub. Date: May 6, 2021

(65) Prior Publication Data
US 2022/0397469 A1 Dec. 15, 2022

(30) Foreign Application Priority Data

Oct. 30, 2019 (JP) ................................. 2019-197606

(51) Int. Cl.
*G01L 1/24* (2006.01)
*H05K 1/02* (2006.01)
(Continued)

(52) U.S. Cl.
CPC .............. *G01L 1/247* (2013.01); *G01L 1/241* (2013.01); *H05K 1/0274* (2013.01); *H05K 1/141* (2013.01);
(Continued)

(58) Field of Classification Search
CPC ......... G01L 1/247; G01L 1/241; G01L 5/166; G01L 1/24; H05K 1/0274; H05K 1/141;
(Continued)

(56) References Cited

U.S. PATENT DOCUMENTS 6,288,851 B1    9/2001  Tomita
7,707,001 B2 *  4/2010  Obinata ................. G01N 19/02
                                                             702/41
(Continued)

FOREIGN PATENT DOCUMENTS

JP    S59153139 A        9/1984
JP     60209128 A  * 10/1985  ............... G01L 1/00
(Continued)

OTHER PUBLICATIONS

International Search Report from corresponding PCT application PCT/JP2020/038452, dated Dec. 22, 2020.

*Primary Examiner* — Freddie Kirkland, III
(74) *Attorney, Agent, or Firm* — K&L Gates LLP

(57) ABSTRACT

An optical sensor according to an embodiment of the present disclosure includes a light emitting substrate and a circuit board. The light emitting substrate includes a light emitting device. The circuit board is provided at a position opposing the light emitting device. The circuit board includes a light transmitting section and one or multiple light receiving devices. The light transmitting section transmits light of the light emitting device. The one or multiple light receiving devices receive light reflected by a reflective layer of the light of the light emitting device exiting through the light (Continued)

transmitting section. For example, the one or multiple light receiving devices are formed on a first major surface of the circuit board. For example, the light emitting substrate is disposed at a position opposing a second major surface, of the circuit board, on an opposite side to the first major surface, and is stacked on the circuit board with a first bump interposed therebetween.

17 Claims, 7 Drawing Sheets

(51) Int. Cl.
*H05K 1/14* (2006.01)
*H05K 1/18* (2006.01)

(52) U.S. Cl.
CPC ..... *H05K 1/181* (2013.01); *H05K 2201/0367* (2013.01); *H05K 2201/10151* (2013.01)

(58) Field of Classification Search
CPC ........... H05K 1/181; H05K 2201/0367; H05K 2201/10151; H05K 1/147; H05K 2201/09072; H05K 2201/10121; G01D 5/26
See application file for complete search history.

(56) References Cited

U.S. PATENT DOCUMENTS

| | | | | |
|---|---|---|---|---|
| 8,749,522 B2* | 6/2014 | Dietzel | ................... | G01L 1/241 |
| | | | | 73/800 |
| 9,366,587 B2* | 6/2016 | Nagura | ................... | G01L 7/086 |
| 9,513,178 B2* | 12/2016 | Tar | ........................... | G01L 5/166 |
| 9,625,333 B2* | 4/2017 | Jentoft | ....................... | G01L 1/02 |
| 9,671,298 B2* | 6/2017 | Sawada | .................... | G01L 1/044 |
| 10,038,854 B1* | 7/2018 | Cooper | ................... | H04N 23/10 |
| 10,162,047 B2* | 12/2018 | Okushiba | ................ | G01S 17/04 |
| 2009/0315989 A1* | 12/2009 | Adelson | ..................... | G01L 1/24 |
| | | | | 348/135 |
| 2010/0253650 A1 | 10/2010 | Dietzel et al. | | |
| 2012/0240691 A1* | 9/2012 | Wettels | ...................... | G01L 1/24 |
| | | | | 73/862.624 |
| 2014/0326882 A1* | 11/2014 | Tar | ........................... | G01L 1/248 |
| | | | | 250/338.1 |
| 2015/0177082 A1 | 6/2015 | Sawada et al. | | |
| 2015/0276518 A1 | 10/2015 | Nagura | | |
| 2016/0320472 A1* | 11/2016 | Okushiba | .......... | H01L 31/02325 |
| 2020/0238537 A1 | 7/2020 | Nagura | | |
| 2020/0393313 A1* | 12/2020 | Yu | ........................... | G01L 1/241 |
| 2021/0156965 A1* | 5/2021 | Oyama | ................... | H01L 25/16 |
| 2023/0215889 A1* | 7/2023 | Yoshita | ............. | H01L 27/14603 |
| | | | | 257/292 |

FOREIGN PATENT DOCUMENTS

| | | | | |
|---|---|---|---|---|
| JP | S60209128 A | | 10/1985 | |
| JP | S6141938 A | | 2/1986 | |
| JP | H08139367 A | | 5/1996 | |
| JP | 2000349306 A | | 12/2000 | |
| JP | 2010539474 A | | 12/2010 | |
| JP | 2015197357 A | | 11/2015 | |
| JP | 2016143561 A | * | 8/2016 | ............. H05B 37/02 |
| JP | 2017166850 A | | 9/2017 | |
| JP | 2019074421 A | | 5/2019 | |
| JP | 2019525132 A | | 9/2019 | |
| WO | 2014045685 A1 | | 3/2014 | |

* cited by examiner

[ FIG. 1 ]
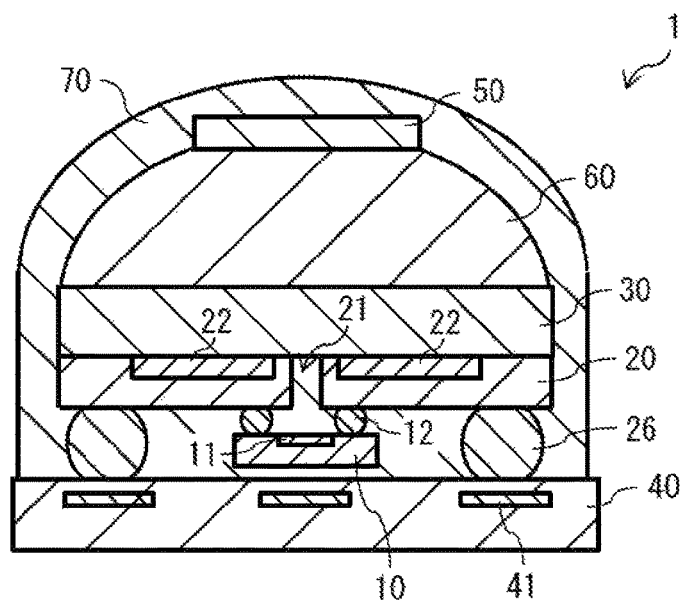
[ FIG. 2 ]
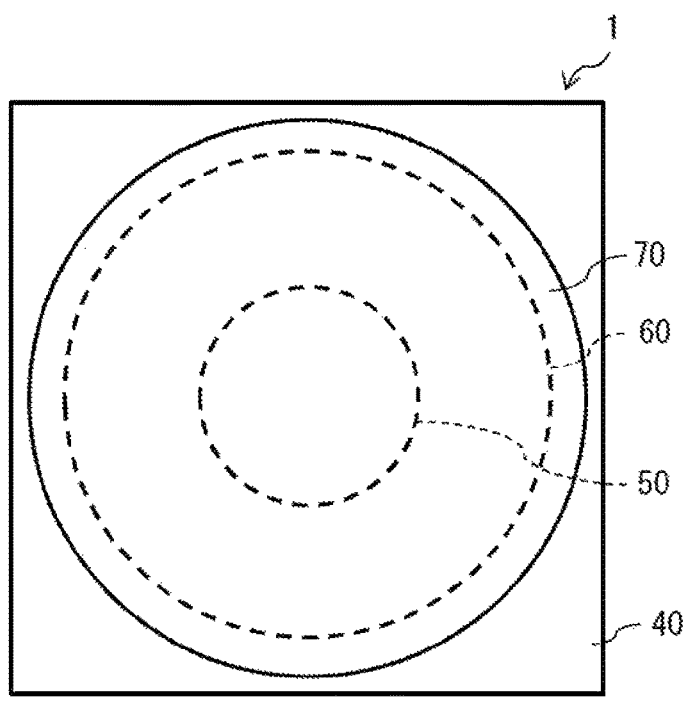

[ FIG. 3 ]
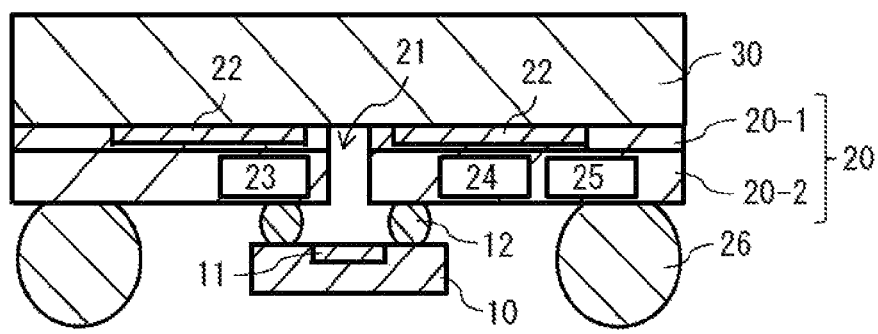
[ FIG. 4 ]
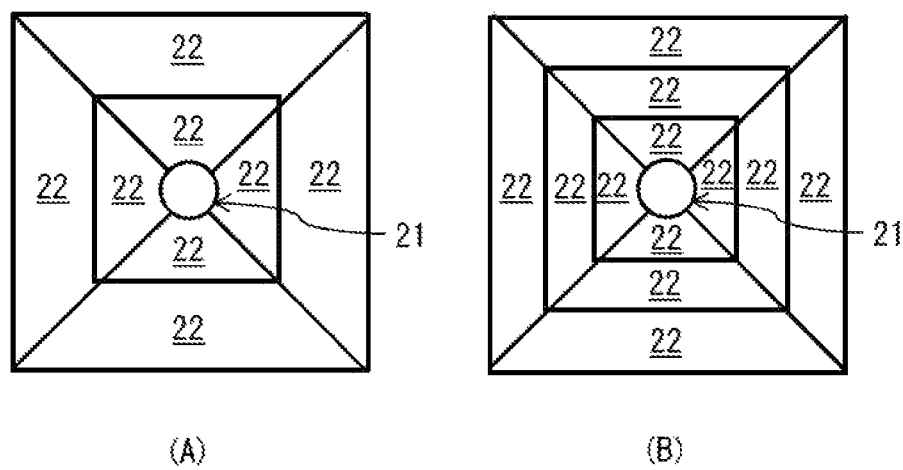
(A)                (B)

[ FIG. 5 ]
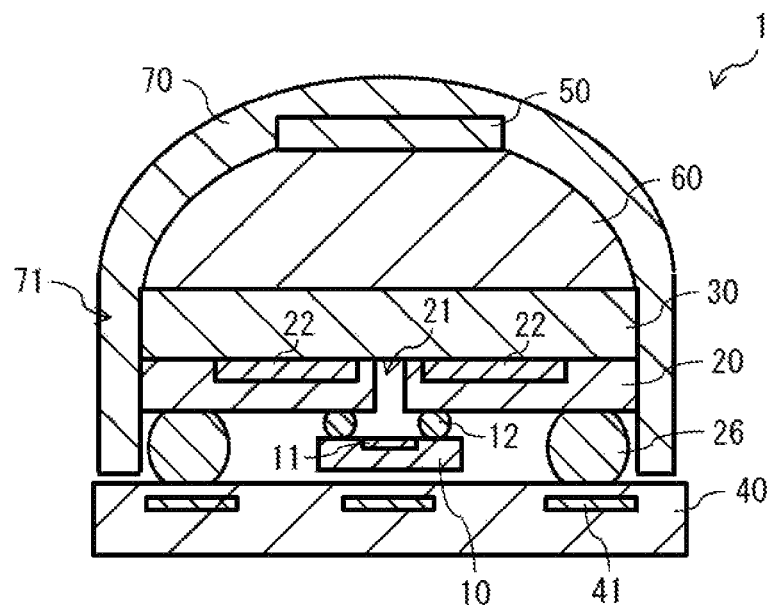
[ FIG. 6 ]
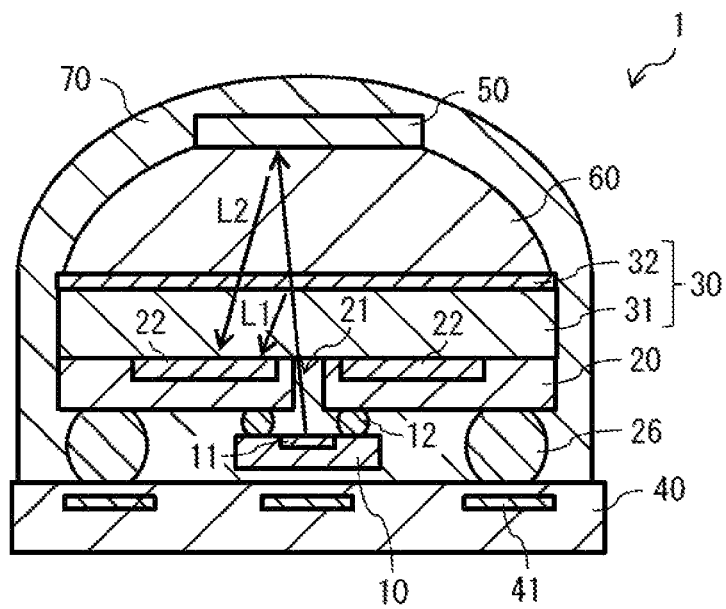

[ FIG. 7 ]
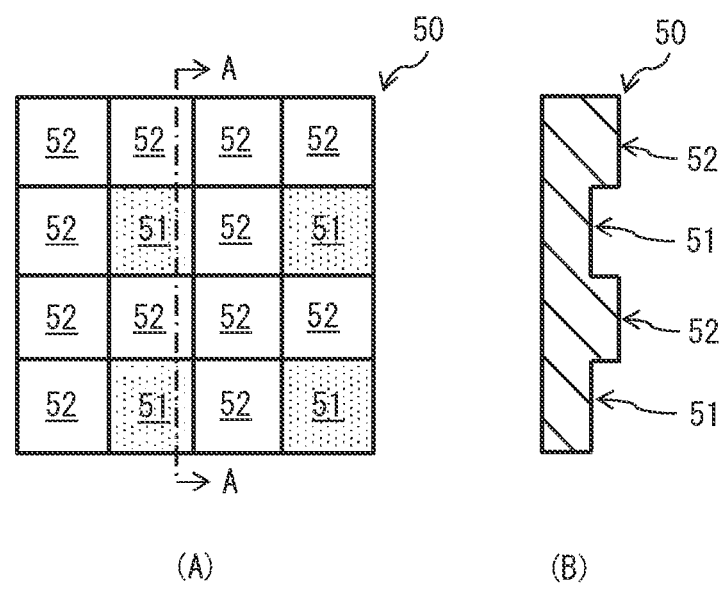
(A)  (B)

[FIG. 8]
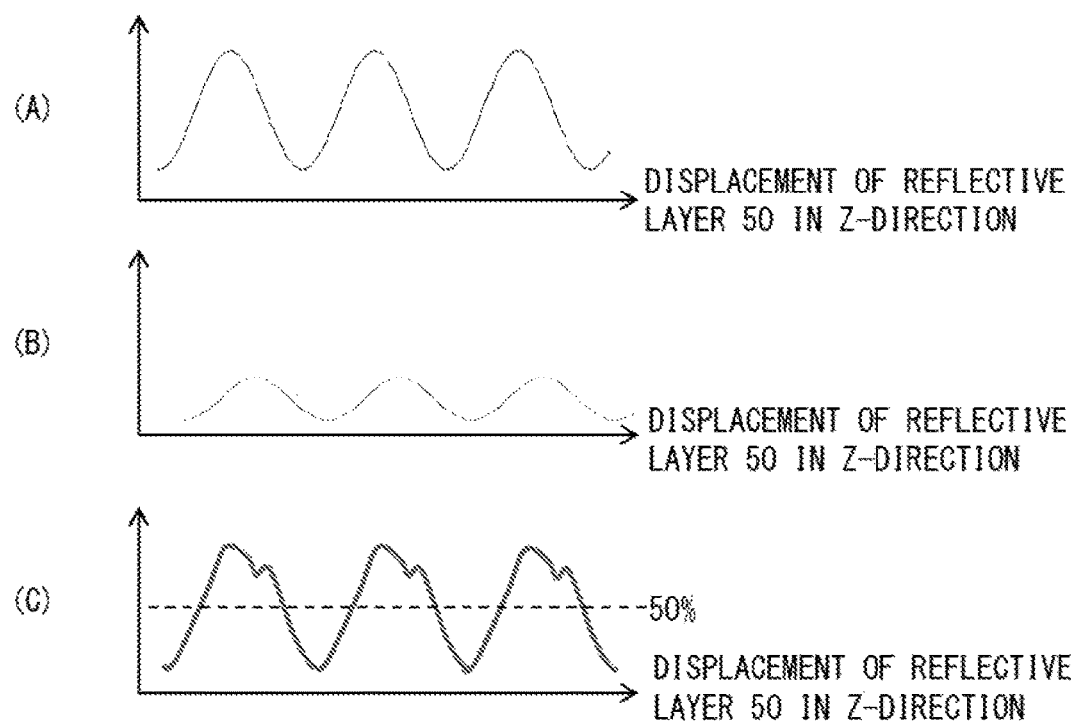

[FIG. 9]
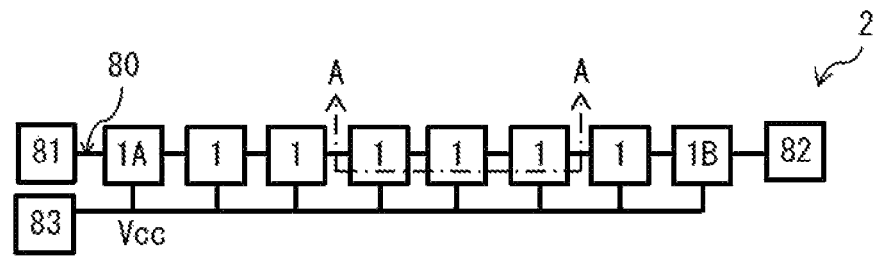
[FIG. 10]
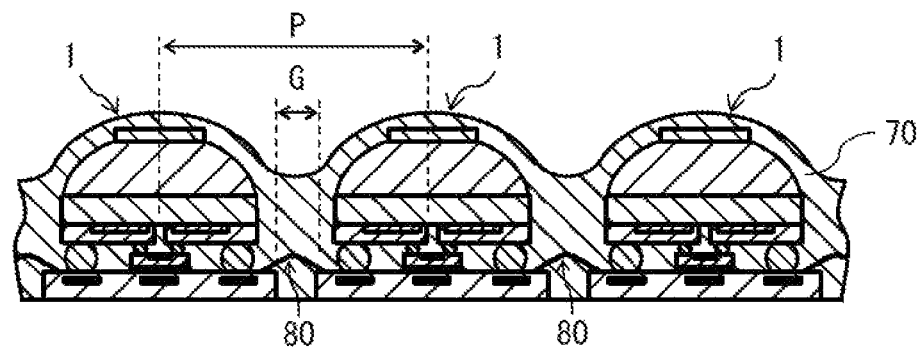
[FIG. 11]
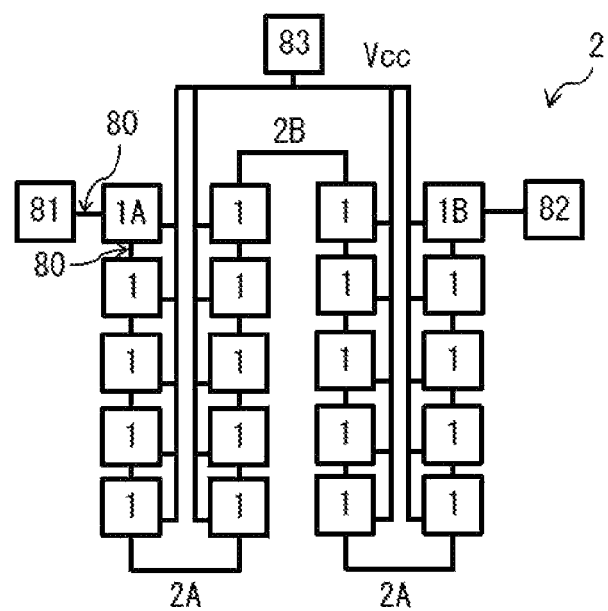

[ FIG. 12 ]
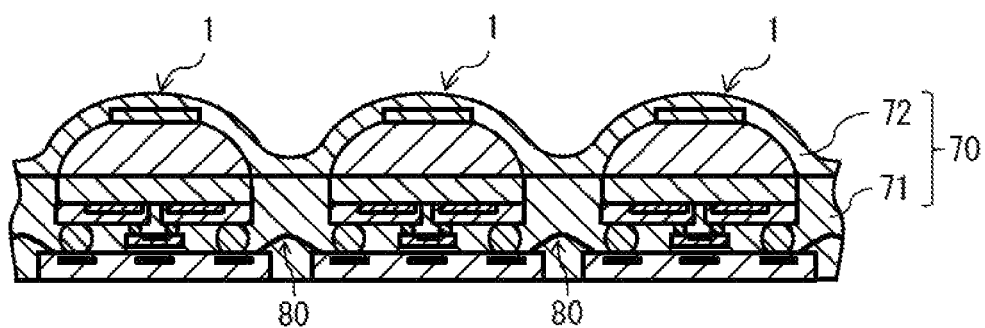

OPTICAL SENSOR AND OPTICAL SENSOR MODULE

TECHNICAL FIELD

The present disclosure relates to an optical sensor and an optical sensor module.

BACKGROUND ART

In order to control handling of an object by a robot, many sensors are used in the robot. Sensors usable in robots are disclosed, for example, in PTLs 1 and 2 below.

CITATION LIST

Patent Literature

PTL 1: US Unexamined Patent Application Publication No. 2010/0253650
PTL 2: Japanese Unexamined Patent Application Publication No. 2015-197357

SUMMARY OF THE INVENTION

Incidentally, if it becomes possible to dispose a large number of sensors at a high density, it becomes possible to obtain various pieces of information difficult to obtain from a single sensor. In particular, in the field of robots, if it becomes possible to dispose a large number of sensors at a tip portion of a robot hand at a high density, it also becomes possible to control the robot hand more precisely. It is therefore desirable to provide an optical sensor and an optical sensor module that are able to be disposed at a high density.

An optical sensor according to one embodiment of the present disclosure includes a light emitting substrate and a circuit board. The light emitting substrate includes a light emitting device. The circuit board is provided at a position opposing the light emitting device. The circuit board includes a light transmitting section and one or multiple light receiving devices. The light transmitting section transmits light of the light emitting device. The one or multiple light receiving devices receive light reflected by a reflective layer of the light of the light emitting device exiting through the light transmitting section.

An optical sensor module according to one embodiment of the present disclosure includes multiple optical sensors coupled in series via a coupling line. The optical sensors each include a light emitting substrate and a circuit board. The light emitting substrate includes a light emitting device. The circuit board is provided at a position opposing the light emitting device. The circuit board includes a light transmitting section and one or multiple light receiving devices. The light transmitting section transmits light of the light emitting device. The one or multiple light receiving devices receive light reflected by a reflective layer of the light of the light emitting device exiting through the light transmitting section. The optical sensor module further includes a wiring substrate and an organic member. The wiring substrate includes a wiring line adapted to electrically coupling the coupling line and the circuit board. The organic member is provided in common to the optical sensors. The organic member prevents external light from entering the one or multiple light receiving devices and fixes the multiple optical sensors in series.

In the optical sensor and the optical sensor module according to the embodiments of the present disclosure, the light emitting substrate including the light emitting device and the circuit board including the one or multiple light receiving devices are stacked, and of the light of the light emitting device exiting through the light transmitting section, the light reflected by the reflective layer is received by the one or multiple light receiving devices. Accordingly, as compared with a case where the light emitting device and the one or multiple light receiving devices are provided on the same surface or a case where the light emitting device and the one or multiple light receiving devices are formed on a common substrate, it is possible to reduce the size of each sensor.

BRIEF DESCRIPTION OF DRAWINGS

FIG. 1 is a diagram illustrating an example of a cross-sectional configuration of an optical three-axis force sensor according to a first embodiment of the present disclosure.

FIG. 2 is a diagram illustrating an example of an upper surface configuration of the optical three-axis force sensor in FIG. 1.

FIG. 3 is a diagram illustrating an example of functional blocks of the optical three-axis force sensor in FIG. 1.

FIG. 4 (A) of FIG. 4 is a diagram illustrating an example of an upper surface configuration of a circuit board in FIG. 1. (B) of FIG. 4 is a diagram illustrating an example of the upper surface configuration of the circuit board in FIG. 1.

FIG. 5 is a diagram illustrating a modification of the cross-sectional configuration of the optical three-axis force sensor in FIG. 1.

FIG. 6 is a diagram illustrating a modification of the cross-sectional configuration of the optical three-axis force sensor in FIG. 1.

FIG. 7 is a diagram illustrating a modification of a reflective surface of a reflective layer in FIG. 1.

FIG. 8 (A) of FIG. 8 is a diagram illustrating an example of a waveform of an amount of light reception from protrusions in FIG. 7. (B) of FIG. 8 is a diagram illustrating an example of a waveform of an amount of light reception from recesses in FIG. 7. (C) of FIG. 8 is a diagram illustrating an example of a waveform in which the waveform of the amount of the light reception in (A) of FIG. 8 and the waveform of the amount of the light reception in (B) of FIG. 8 are superimposed.

FIG. 9 is a diagram illustrating an example of a plan configuration of an optical three-axis force sensor module according to a second embodiment of the present disclosure.

FIG. 10 is a diagram illustrating an example of a cross-sectional configuration of the optical three-axis force sensor module in FIG. 9.

FIG. 11 is a diagram illustrating a modification of the plan configuration of the optical three-axis force sensor module in FIG. 9.

FIG. 12 is a diagram illustrating a modification of the cross-sectional configuration of the optical three-axis force sensor module in FIG. 9.

MODES FOR CARRYING OUT THE INVENTION

Some embodiments of the present disclosure are described below in detail with reference to the drawings. The following description is a specific example of the present disclosure, and the present disclosure is not limited to the following embodiments. In addition, the present disclosure is not limited to arrangements, dimensions, dimension ratios, etc. of respective components illustrated in each drawing. It is to be noted that the description is given in the following order.

1. First Embodiment (optical three-axis force sensor)
2. Modifications (optical three-axis force sensor)
3. Second Embodiment (optical three-axis force sensor module)

1. First Embodiment

Configuration

A description is given of a configuration of an optical three-axis force sensor 1 according to a first embodiment of the present disclosure. FIG. 1 illustrates an example of a cross-sectional configuration of the optical three-axis force sensor 1 according to the present embodiment. FIG. 2 illustrates an example of an upper surface configuration of the optical three-axis force sensor 1 in FIG. 1. The optical three-axis force sensor 1 includes a light emitting substrate 10, a circuit board 20, a light-transmissive substrate 30, a wiring substrate 40, a reflective layer 50, a deformation layer 60, and a light blocking section 70. The optical three-axis force sensor 1 corresponds to a specific example of an "optical sensor" of the present disclosure.

The light emitting substrate 10 and the circuit board 20 are stacked on each other. The light emitting substrate 10 is disposed at a position opposing a lower surface (a second major surface) of the circuit board 20. The light-transmissive substrate 30 is disposed at a position opposing an upper surface (a first major surface) of the circuit board 20. The wiring substrate 40 is disposed at a position opposing the circuit board 20 with the light emitting substrate 10 interposed therebetween. The reflective layer 50 and the deformation layer 60 are disposed at positions opposing an upper surface of the light-transmissive substrate 30. The reflective layer 50 is disposed at a position opposing the light-transmissive substrate 30 with the deformation layer 60 interposed therebetween. The light blocking section 70 covers the reflective layer 50, the deformation layer 60, and the light-transmissive substrate 30.

The light emitting substrate 10 includes a light emitting device 11. The light emitting device 11 is provided on an upper surface (a surface on a side of the circuit board 20) of the light emitting substrate 10. The light emitting device 11 is provided, for example, at a middle portion of the light emitting substrate 10. The light emitting substrate 10 has, for example, a configuration in which the light emitting device 11 is provided on a GaAs substrate. The light emitting device 11 includes, for example, a vertical cavity surface emitting laser (VCSEL, Vertical Cavity Surface Emitting LASER). The light emitting device 11 may include a laser of an end-surface light emission type or an LED. The light emitting device 11 emits light having a predetermined divergence angle.

The circuit board 20 includes a light transmitting section 21 that transmits light of the light emitting device 11. The light transmitting section 21 is provided at a position opposing the light emitting device 11, and is provided, for example, at a middle portion of the circuit board 20. For example, as illustrated in FIG. 1, the light transmitting section 21 is a through hole running through the circuit board 20. The circuit board 20 further includes one or multiple light receiving devices 22 that receive, of the light of the light emitting device 11 exiting through the light transmitting section 21, light reflected by the reflective layer 50. The one or multiple light receiving devices 22 are formed on the upper surface (a surface on an opposite side to the light emitting substrate 10) of the circuit board 20. For example, as illustrated in FIG. 3, the circuit board 20 includes a light receiving substrate 20-1 on which the one or multiple light receiving devices 22 are formed.

The one or multiple light receiving devices 22 are disposed around the light transmitting section 21. In a case where the multiple light receiving devices 22 are formed on the upper surface of the circuit board 20, for example, as illustrated in (A) and (B) of FIG. 4, the multiple light receiving devices 22 are arranged in an X-axis direction and a Y-axis direction on the upper surface of the circuit board 20. An X-axis and a Y-axis correspond to two axes in a plane parallel to the upper surface of the circuit board 20. The multiple light receiving devices 22 are disposed, for example, in a region 20a in the vicinity of the light transmitting section 21 and in a region 20b away from the light transmitting section 21. It is to be noted that (A) of FIG. 4 illustrates, as an example, a case where four light receiving devices 22 are formed in the region 20a in the vicinity of the light transmitting section 21, and four light receiving devices 22 are formed in the region 20b away from the light transmitting section 21. In addition, (B) of FIG. 4 illustrates, as an example, a case where eight light receiving devices 22 are formed in the region 20a in the vicinity of the light transmitting section 21, and four light receiving devices 22 are formed in the region 20b away from the light transmitting section 21. The light receiving device 22 includes, for example, a PD (photodiode), an APD (avalanche photodiode), or an SPAD (single photon avalanche diode).

For example, as illustrated in FIG. 3, the circuit board 20 includes a control circuit 23, a DSP (Digital Signal Processing) circuit 24, and a SerDes (SERializer/DESerializer) circuit 25. The control circuit 23 controls light emission of the light emitting device 11. The DSP circuit 24 processes a light reception signal 22A obtained by the one or multiple light receiving devices 22. Upon receiving a trigger signal, the control circuit 23 supplies, to the light emitting device 11, a signal that causes light emission driving of the light emitting device 11. Upon receiving the signal causing the light emission driving from the control circuit 23, the light emitting device 11 emits light toward the light transmitting section 21.

The DSP circuit 24 performs various kinds of signal processing on the light reception signal 22A obtained by the one or multiple light receiving devices 22. For example, the DSP circuit 24 calculates displacements of the reflective layer 50 in three axis directions (the X-axis, the Y-axis, and a Z-axis) caused by an external force, on the basis of the light reception signal 22A obtained by the one or multiple light receiving devices 22, and outputs them to an outside. The Z-axis corresponds to an axis that is parallel to a normal to the upper surface of the circuit board 20. The SerDes circuit 25 performs serial/parallel conversion on a signal supplied from the DSP circuit 24. The SerDes circuit 25 outputs, to the outside, a signal after the serial/parallel conversion as measured data 25A (packet data). The DSP circuit 24 and the SerDes circuit 25 correspond to a specific example of a "processing circuit" of the present disclosure. For example, as illustrated in FIG. 3, the circuit board 20 includes a signal processing substrate 20-2 on which the control circuit 23, the DSP circuit 24, and the SerDes circuit 25 are formed. The light receiving substrate 20-1 is, for example, stacked on the signal processing substrate 20-2.

A size of the light emitting substrate 10 in an XY plane is, for example, smaller than a size of the circuit board 20 in the XY plane. For example, the light emitting substrate 10 is stacked on a middle portion of the lower surface of the circuit board 20 with multiple bumps 12 interposed therebetween. The bump 12 corresponds to a specific example of a "first bump" of the present disclosure. The bump 12 includes, for example, a solder material. The light emitting substrate 10 (the light emitting device 11) is electrically coupled to the circuit board 20 (the control circuit 23 and the DSP circuit 24) via the multiple bumps 12.

The light-transmissive substrate 30 is a substrate that supports the circuit board 20 and transmits the light of the light emitting device 11. The light-transmissive substrate 30 includes, for example, a quartz substrate such as glass. The circuit board 20 is attached to a lower surface (e.g., a surface of the quartz substrate) on the light-transmissive substrate 30. A size of the light-transmissive substrate 30 in the XY plane is, for example, the same as or almost the same as the size of the circuit board 20 in the XY plane.

The wiring substrate 40 includes a wiring line 41 adapted to electrically coupling an external circuit and the circuit board 20 (the control circuit 23 and the SerDes circuit 25). The wiring substrate 40 is, for example, a flexible substrate including the wiring line 41 and a resin layer that supports the wiring line 41. Mounted on an upper surface of the wiring substrate 40 are the light emitting substrate 10 and the circuit board 20. For example, the circuit board 20 is stacked on the upper surface of the wiring substrate 40 with multiple bumps 26 interposed therebetween. The bump 26 corresponds to a specific example of a "second bump" of the present disclosure. The light emitting substrate 10 is disposed in a gap formed between the circuit board 20 and the wiring substrate 40 by the multiple bumps 26. The bump 26 includes, for example, a solder material. The circuit board 20 is electrically coupled to the wiring substrate 40 (the wiring line 41) via the multiple bumps 26.

The deformation layer 60 supports the reflective layer 50. The deformation layer 60 is fixed to the upper surface of the light-transmissive substrate 30. The deformation layer 60 includes an organic material having softness that allows for deformation caused by an external force and a property of transmitting the light of the light emitting device 11. For example, the deformation layer 60 includes silicone. The deformation layer 60 has, for example, a dome shape or a trapezoidal shape. For example, when an external force is applied to the deformation layer 60, the deformation layer 60 is deformed, thereby allowing a position, an orientation, and a shape of the reflective layer 50 to be changed.

The reflective layer 50 is provided at a position opposing the light-transmissive substrate 30 with the deformation layer 60 interposed therebetween. The reflective layer 50 is provided, for example, at a position opposing the light transmitting section 21. The light emitting device 11, the light transmitting section 21, and the reflective layer 50 are disposed, for example, at respective positions that allow an optical axis of the light emitting device 11, a central axis of the light transmitting section 21, and a central axis of the reflective layer 50 to overlap each other. The reflective layer 50 includes a reflective surface that reflects the light of the light emitting device 11. The reflective surface may be a flat surface, or may be a curved surface. The reflective surface of the reflective layer 50 includes, for example, a metal material having a high reflectance with respect to the light of the light emitting device 11. The reflective layer 50 is, for example, a layer formed by depositing the metal material having a high reflectance with respect to the light of the light emitting device 11 on a surface of a rubber substrate, a plastic substrate, a Si substrate, or a glass substrate. The reflective surface of the reflective layer 50 may include, for example, a dielectric multilayer film having a high reflectance with respect to the light of the light emitting device 11.

The light blocking section 70 prevents external light from entering the reflective layer 50 and the one or multiple light receiving devices 22. The light blocking section 70 covers the reflective layer 50, the deformation layer 60, and the light-transmissive substrate 30, and is fixed to the reflective layer 50, the deformation layer 60, and the light-transmissive substrate 30. The light blocking section 70 includes an organic material having softness and a property of absorbing external light, the light of the light emitting device 11, and the like. The light blocking section 70 includes, for example, silicone including carbon black.

Operation

Next, operation of the optical three-axis force sensor 1 is described.

A trigger signal is supplied from the outside to the control circuit 23 via the wiring substrate 40. Then, upon receiving the trigger signal, the control circuit 23 supplies, to the light emitting device 11, a signal that causes light emission driving of the light emitting device 11. Upon receiving the signal that causes light emission driving from the control circuit 23, the light emitting device 11 emits light toward the light transmitting section 21. The light emitted from the light emitting device 11 passes through the light transmitting section 21, and thereafter enters the reflective layer 50 at a predetermined divergence angle. The light emitted from the light emitting device 11 is reflected at the reflective layer 50 at a reflection angle based on the position, the orientation, and the shape of the reflective layer 50, and enters the one or multiple light receiving devices 22. The light having entered the one or multiple light receiving devices 22 is photoelectrically converted by the one or multiple light receiving devices 22 to be a digital light reception signal 22A. The digital light reception signal 22A is supplied to the DSP circuit 24. The DSP circuit 24 performs various kinds of signal processing on the received light reception signal 22A. For example, the DSP circuit 24 calculates the displacements of the reflective layer 50 in the three axis directions (the X-axis, the Y-axis, and the Z-axis) caused by an external force, on the basis of the light reception signal 22A, and outputs them to the SerDes circuit 25. The SerDes circuit 25 performs serial/parallel conversion on a signal supplied from the DSP circuit 24, and outputs packet data as the measured data 25A to the outside. The optical three-axis force sensor 1 executes the above-described process each time the trigger signal is supplied from the outside.

Effects

Next, effects of the optical three-axis force sensor 1 are described.

In the present embodiment, the light emitting substrate 10 including the light emitting device 11 and the circuit board 20 including the one or multiple light receiving devices 22 are stacked, and of the light of the light emitting device 11 exiting through the light transmitting section 21, the light reflected by the reflective layer 50 is received by the one or multiple light receiving devices 22. Accordingly, as compared with a case where the light emitting device 11 and the one or multiple light receiving devices 22 are provided on the same surface or a case where the light emitting device 11 and the one or multiple light receiving devices 22 are formed on a common substrate, it is possible to reduce the size of each optical three-axis force sensor 1. As a result, it is possible to dispose multiple optical three-axis force sensors 1 at a high density.

In the present embodiment, the one or multiple light receiving devices 22 are formed on the upper surface of the circuit board 20, and the light emitting substrate 10 is disposed at the position opposing the lower surface of the circuit board 20 and is stacked on the circuit board 20 with the multiple bumps 12 interposed therebetween. Accordingly, as compared with the case where the light emitting device 11 and the one or multiple light receiving devices 22 are provided on the same surface or the case where the light emitting device 11 and the one or multiple light receiving devices 22 are formed on a common substrate, it is possible to reduce the size of each optical three-axis force sensor 1. As a result, it is possible to dispose multiple optical three-axis force sensors 1 at a high density.

In the present embodiment, the control circuit 23 that controls the light emission of the light emitting device 11 and the processing circuits (the DSP circuit 24 and the SerDes circuit 25) that process the light reception signal 22A obtained by the one or multiple light receiving devices 22 are provided on the circuit board 20. Accordingly, as compared with a case where these circuits are provided on the wiring substrate 40 or outside, it is possible to reduce the size of each optical three-axis force sensor 1. As a result, it is possible to dispose multiple optical three-axis force sensors 1 at a high density.

In the present embodiment, the wiring substrate 40 is provided at a position opposing the circuit board 20 with the light emitting substrate 10 interposed therebetween, and the wiring substrate 40 is stacked on the circuit board 20 with the bumps 26 interposed therebetween. Providing the wiring substrate 40 for each optical three-axis force sensor 1 in such a manner makes it possible to dispose multiple optical three-axis force sensors 1 at a high density even on a curved surface.

In the present embodiment, the light transmitting section 21 is a through hole running through the circuit board 20. Accordingly, it is possible to cause the light emitted from the light emitting device 11 to reach the reflective layer 50 without being attenuated by the light transmitting section 21. As a result, because it is not necessary to excessively increase power of the light emitting device 11, it is possible to reduce power consumption in the optical three-axis force sensor 1 to be low.

In the present embodiment, the multiple light receiving devices 22 are disposed around the light transmitting section 21. Accordingly, it is possible to accurately capture, by the multiple light receiving devices 22, a change in reflected light based on the position, the orientation, and the shape of the reflective layer 50 changed by an external force. As a result, it is possible to accurately calculate, by the DSP circuit 24, the displacements of the reflective layer 50 in the three axis directions (the X-axis, the Y-axis, and the Z-axis).

In the present embodiment, the reflective layer 50, the light-transmissive deformation layer 60 supporting the reflective layer 50 and being deformable by an external force, and the light blocking section 70 preventing external light from entering the reflective layer 50 and the one or multiple light receiving devices 22 are provided. Accordingly, it is possible to accurately capture, by the one or multiple light receiving devices 22, the change in the reflected light based on the position, the orientation, and the shape of the reflective layer 50 changed by an external force. As a result, it is possible to accurately calculate, by the DSP circuit 24, the displacements of the reflective layer 50 in the three axis directions (the X-axis, the Y-axis, and the Z-axis).

In the present embodiment, the deformation layer 60 is fixed to the light-transmissive substrate 30, and the light blocking section 70 covers the reflective layer 50, the deformation layer 60, and the light-transmissive substrate 30. This makes it possible to reduce an influence of external light. As a result, it is possible to accurately calculate, by the DSP circuit 24, the displacements of the reflective layer 50 in the three axis directions (the X-axis, the Y-axis, and the Z-axis).

2. Modifications

Next, a description is given of modifications of the optical three-axis force sensor 1 according to the above-described embodiment.

Modification A

In the above-described embodiment, the reflective layer 50 may be fixed to the light blocking section 70 and in contact with the deformation layer 60 without being fixed thereto, and the light blocking section 70 may be configured to be attachable to and detachable from the light-transmissive substrate 30. In addition, in the above-described embodiment, the reflective layer 50 and the deformation layer 60 may be fixed to the light blocking section 70 and in contact with the light-transmissive substrate 30 without being fixed thereto, and the light blocking section 70 may be configured to be attachable to and detachable from the light-transmissive substrate 30. In these cases, for example, as illustrated in FIG. 5, the light blocking section 70 may have a mechanism 71 that is attachable to and detachable from the light-transmissive substrate 30. The mechanism 71 has, for example, a configuration to be fitted to the light-transmissive substrate 30 attachably to and detachably from the light-transmissive substrate 30. In such a case, it is possible to easily replace the light blocking section 70 in a case such as a case where the light blocking section 70 deteriorates.

Modification B

In the first embodiment and the modification thereof described above, for example, as illustrated in FIG. 6, the light-transmissive substrate 30 may have a configuration in which a half mirror layer 32 reflecting a portion of the light of the light emitting device 11 is provided on an upper surface (a surface on a side of the reflective layer 50) of a quartz substrate 31 such as glass. In such a case, a fringe based on the displacement of the reflective layer 50 is generated by reflected light L1 at the half mirror layer 32 and reflected light L2 at the reflective layer 50 in the region 20a in the vicinity of the light transmitting section 21. Therefore, it is possible for the DSP circuit 24 to detect the fringe based on the displacement of the reflective layer 50 by performing predetermined signal processing on the light reception signal 22A obtained by two or more light receiving devices 22 provided in the region 20a in the vicinity of the light transmitting section 21, among the multiple light receiving devices 22. It is possible for the DSP circuit 24 to calculate the displacement of the reflective layer 50 in a Z-axis direction with higher accuracy on the basis of the detected fringe.

Modification C

In the first embodiment and the modifications thereof described above, the reflective layer 50 may have regular protrusions and recesses on the reflective surface. For example, as illustrated in (A) of FIG. 7 and (B) of FIG. 7, the reflective layer 50 has a reflective surface on which multiple recesses 51 and multiple protrusions 52 are arranged in the X-axis direction and the Y-axis direction. For example, the multiple recesses 51 are so formed on the reflective surface in such a manner that an occupied area of the multiple recesses 51 is an area of about 25% of the entire reflective surface. A depth of each of the recesses 51 is, for example, about 100 nm. In this case, an amount of light reception from the multiple protrusions 52 exhibits, for example, a displacement illustrated in (A) of FIG. 8 with respect to the displacement of the reflective layer 50 in the Z-axis direction. Meanwhile, an amount of light reception from the multiple recesses 51 exhibits, for example, a displacement illustrated in (B) of FIG. 8 with respect to the displacement of the reflective layer 50 in the Z-axis direction.

As can be seen from (A) of FIG. 8 and (B) of FIG. 8, the amount of the light reception from the multiple recesses 51 is about ⅓ of the amount of the light reception from the multiple protrusions 52, and a phase of the amount of the light reception from the multiple recesses 51 slightly shifts from a phase of the amount of the light reception from the multiple protrusions 52. Therefore, for example, as illustrated in (C) of FIG. 8, a fringe based on the displacement of the reflective layer 50 is generated by reflected light from the multiple protrusions 52 and reflected light from the multiple recesses 51. This fringe does not have a waveform symmetrical to a peak, but has an asymmetrical waveform. Therefore, for example, it is possible for the DSP circuit 24 to start integration of the light reception amount when a light amount of the fringe exceeds 50%, end the integration of the light reception amount when the light amount of the fringe becomes 50% or less, and determine whether the displacement of the reflective layer 50 in the Z-axis direction is in a + direction or a − direction on the basis of whether a peak of the light amount is in a first half of a total light amount or in a second half thereof.

3. Second Embodiment

Configuration

A description is given of a configuration of an optical three-axis force sensor module 2 according to a second embodiment of the present disclosure. FIG. 9 illustrates an example of a plan configuration of the optical three-axis force sensor module 2 according to the present embodiment. FIG. 10 illustrates an example of a cross-sectional configuration of the optical three-axis force sensor module 2 in FIG. 9 taken along a line A-A. The optical three-axis force sensor module 2 includes multiple optical three-axis force sensors 1 coupled in series via a coupling line 80. For example, the coupling line 80 basically includes a clock pair differential line and a data pair differential line, and also includes several kinds of other control lines. The optical three-axis force sensor 1 corresponds to a specific example of an "optical sensor module" of the present disclosure.

In the present embodiment, the light blocking section 70 is provided in common to the optical three-axis force sensors 1. The light blocking section 70 prevents external light from entering the one or multiple light receiving devices 22, and fixes the multiple optical three-axis force sensors 1 in series. The light blocking section 70 corresponds to a specific example of an "organic member" of the present disclosure. In each of the optical three-axis force sensors 1, the coupling line 80 and the wiring substrate 40 (specifically, the wiring line 41) are coupled to each other, and the coupling line 80 and the circuit board 20 (specifically, the control circuit 23 and the SerDes circuit 25) are electrically coupled to each other. In the optical three-axis force sensor module 2, a gap G between the two wiring substrates 40 adjacent to each other is smaller than an arrangement pitch P of the multiple optical three-axis force sensors 1. The arrangement pitch P is, for example, about 1 mm.

For example, as illustrated in FIG. 9, the optical three-axis force sensor module 2 includes a control device 81 coupled, via the coupling line 80, to an optical three-axis force sensor 1 (1A) disposed at one end, of the multiple optical three-axis force sensors 1 coupled in series. The control device 81 controls light emission of the light emitting device 11 in each of the optical three-axis force sensors 1. The control device 81 supplies a trigger signal controlling the light emission of the light emitting device 11 to the optical three-axis force sensor 1A at a predetermined cycle.

Upon receiving the trigger signal, the optical three-axis force sensor 1A supplies, to the light emitting device 11, a signal that causes light emission driving of the light emitting device 11, and supplies generated packet data as the measured data 25A to an optical three-axis force sensor 1 adjacent to the optical three-axis force sensor 1A via the coupling line 80. Upon receiving the packet data as the measured data 25A from the optical three-axis force sensor 1A via the coupling line 80, the optical three-axis force sensor 1 adjacent to the optical three-axis force sensor 1A regards this input as the trigger signal that controls the light emission of the light emitting device 11, and supplies, to the light emitting device 11, a signal that causes light emission driving of the light emitting device 11. The optical three-axis force sensor 1 adjacent to the optical three-axis force sensor 1A supplies, to an optical three-axis force sensor 1 adjacent thereto, packet data including the measured data 25A obtained by the optical three-axis force sensor 1A and the measured data 25A obtained by its own measurement, via the coupling line 80. In the optical three-axis force sensor module 2, light emission control and data transmission are thus performed in a bucket relay manner.

For example, as illustrated in FIG. 9, the optical three-axis force sensor module 2 further includes an interface device 82 coupled, via the coupling line 80, to an optical three-axis force sensor 1 (1B) disposed at the other end, of the multiple optical three-axis force sensors 1 coupled in series. The interface device 82 outputs, to the outside, the light reception signal 22A obtained by the one or multiple light receiving devices 22 in each of the optical three-axis force sensors 1 or a signal corresponding to the light reception signal 22A (packet data including the measured data 25A).

For example, as illustrated in FIG. 9, the optical three-axis force sensor module 2 further includes a power supply circuit 83 that supplies electric power to the multiple optical three-axis force sensors 1 coupled in series. The power supply circuit 83 supplies a power supply voltage Vcc from a side of the optical three-axis force sensor 1A in the multiple optical three-axis force sensors 1 coupled in series.

Effects

Next, effects of the optical three-axis force sensor module 2 are described.

In the present embodiment, the light blocking section 70 is provided in common to the optical three-axis force sensors 1. The light blocking section 70 prevents external light from entering the one or multiple light receiving devices 22, and fixes the multiple optical three-axis force sensors 1 in series. Accordingly, as compared with a case where the respective optical three-axis force sensors 1 are disposed separately, it is possible to dispose the multiple optical three-axis force sensors 1 at a high density.

In the present embodiment, in each of the optical three-axis force sensors 1, the reflective layer 50 and the light-transmissive deformation layer 60 that supports the reflective layer 50 and is deformable by an external force are provided. Accordingly, it is possible to accurately capture, by the one or multiple light receiving devices 22, the change in the reflected light based on the position, the orientation, and the shape of the reflective layer 50 changed by an external force. As a result, it is possible to accurately calculate, by the DSP circuit 24, the displacements of the reflective layer 50 in the three axis directions (the X-axis, the Y-axis, and the Z-axis).

In the present embodiment, in each of the optical three-axis force sensors 1, the deformation layer 60 is fixed to the light-transmissive substrate 30, and the light blocking section 70 covers the reflective layer 50, the deformation layer 60, and the light-transmissive substrate 30. This makes it possible to reduce an influence of external light. As a result, it is possible to accurately calculate, by the DSP circuit 24, the displacements of the reflective layer 50 in the three axis directions (the X-axis, the Y-axis, and the Z-axis).

In the present embodiment, the control device 81 and the interface device 82 are provided. This makes it possible to perform the control of the light emission of the multiple optical three-axis force sensors 1 coupled in series and transmission of data obtained by the multiple optical three-axis force sensors 1 coupled in series in a bucket relay manner. Accordingly, it is possible to achieve the light emission control and the data transmission by a simple method.

In the present embodiment, the arrangement pitch of the multiple optical three-axis force sensors 1 is smaller than the size of the wiring substrate 40. Accordingly, it is possible to dispose the multiple optical three-axis force sensors 1 at a high density.

Note that in a case where the optical three-axis force sensor module 2 includes a number of optical three-axis force sensors 1, for example, as illustrated in FIG. 11, it is preferable that the multiple optical three-axis force sensors 1 coupled in series have a zigzag serpentine layout. In such a case, it is possible for the power supply circuit 83 to supply the power supply voltage Vcc from a side of a U-turn portion 2A of the multiple optical three-axis force sensors 1 coupled in series, and supply a reference voltage GND to a side of a U-turn portion 2B corresponding to the U-turn portion 2A in the multiple optical three-axis force sensors 1 coupled in series. This prevents a malfunction of a sensor due to a voltage drop.

Moreover, in the present embodiment, the reflective layer 50 may be fixed to the light blocking section 70 and in contact with the deformation layer 60 without being fixed thereto, and the light blocking section 70 may be configured to be attachable to and detachable from the light-transmissive substrate 30. Moreover, in the present embodiment, the reflective layer 50 and the deformation layer 60 may be fixed to the light blocking section 70 and in contact with the light-transmissive substrate 30 without being fixed thereto, and the light blocking section 70 may be configured to be attachable to and detachable from the light-transmissive substrate 30. In these cases, the light blocking section 70 may include, for example, the mechanism 71 described above. In such a case, it is possible to easily replace the deformation layer 60 in a case such as a case where the deformation layer 60 deteriorates.

In addition, in these cases, for example, as illustrated in FIG. 12, the light blocking section 70 may include a fixed part 72 fixed to the light-transmissive substrate 30, and a replacement part 73 that is in contact with the fixed part 72 in a state that the replacement part 73 is removable from the fixed part 72.

The deformation layer 60 may be fixed to the replacement part 73 and in contact with the light-transmissive substrate 30 without being fixed thereto. In this case, from the viewpoint of avoiding the deformation layer 60 being fixed to the fixed part 72, it is preferable that an upper surface of the fixed part 72 (a boundary portion between the fixed part 72 and the replacement part 73) be disposed in the same plane as or at a position lower than the upper surface of the light-transmissive substrate 30 (a boundary portion between the light-transmissive substrate 30 and the deformation layer 60). Moreover, the deformation layer 60 may be fixed to the light-transmissive substrate 30 and in contact with the replacement part 73 without being fixed thereto. In this case, the deformation layer 60 may be in contact with the fixed part 72, or may not be in contact with the fixed part 72.

Thus causing the light blocking section 70 to include the fixed part 72 and the replacement part 73 makes it possible to easily replace a deteriorated portion (the replacement part 73) in a case such as a case where the surface of the light blocking section 70 (a surface of the replacement part 73) deteriorates.

The present disclosure has been described above with reference to the embodiments and the modifications thereof; however, the present disclosure is not limited to the embodiments and the like described above and may be variously modified. Note that the effects described herein are merely illustrative. Effects of the present disclosure are not limited to the effects described herein. The present disclosure may have effects other than the effects described herein.

Moreover, for example, the present disclosure may have the following configurations.

(1)
An optical sensor including:
  a light emitting substrate including a light emitting device; and
  a circuit board provided at a position opposing the light emitting device, the circuit board including a light transmitting section and one or multiple light receiving devices, the light transmitting section transmitting light of the light emitting device, the one or multiple light receiving devices receiving light reflected by a reflective layer of the light of the light emitting device exiting through the light transmitting section.

(2)
The optical sensor according to (1), in which
  the one or multiple light receiving devices are formed on a first major surface of the circuit board, and
  the light emitting substrate is disposed at a position opposing a second major surface, of the circuit board, on an opposite side to the first major surface, and is stacked on the circuit board with a first bump interposed therebetween.

(3)
The optical sensor according to (1) or (2), in which the circuit board further includes a control circuit and a processing circuit, the control circuit controlling light emission of the light emitting device, the processing circuit processing a light reception signal obtained by the one or multiple light receiving devices.

(4)

The optical sensor according to (3), further including a wiring substrate including a wiring line adapted to electrically coupling an external circuit and each of the control circuit and the processing circuit, the wiring substrate being disposed at a position opposing the circuit board with the light emitting substrate interposed therebetween and being stacked on the circuit board with a second bump interposed therebetween.

(5)

The optical sensor according to any one of (1) to (4), in which the light transmitting section is a through hole running through the circuit board.

(6)

The optical sensor according to any one of (1) to (5), in which the multiple light receiving devices are disposed around the light transmitting section.

(7)

The optical sensor according to any one of (1) to (6), further including:
  the reflective layer;
  a deformation layer that supports the reflective layer and is deformable by an external force and light transmissive; and
  a light blocking section that prevents external light from entering the reflective layer and the one or multiple light receiving devices.

(8)

The optical sensor according to (7), further including
  a light-transmissive substrate that supports the circuit board, in which
  the deformation layer is fixed to the light-transmissive substrate, and
  the light blocking section covers the reflective layer, the deformation layer, and the light-transmissive substrate.

(9)

The optical sensor according to (7), further including
  a light-transmissive substrate that supports the circuit board, in which
  the deformation layer is fixed to the light blocking section, and
  the light blocking section is configured to be attachable to and detachable from the light-transmissive substrate.

(10)

The optical sensor according to (7), further including
  a light-transmissive substrate that supports the circuit board, in which
  the light-transmissive substrate includes a half mirror layer on a surface on an opposite side to the circuit board, and
  the multiple light receiving devices are disposed in a region in vicinity of the light transmitting section and a region away from the light transmitting section.

(11)

The optical sensor according to (7), in which the reflective layer has regular protrusions and recesses on a reflective surface.

(12)

The optical sensor according to (3) or (4), in which the processing circuit calculates a displacement of the reflective layer caused by an external force on the basis of the light reception signal and outputs it to an outside.

(13)

An optical sensor module including
  multiple optical sensors coupled in series via a coupling line,
  the optical sensors each including
    a light emitting substrate including a light emitting device,
    a circuit board provided at a position opposing the light emitting device, the circuit board including a light transmitting section and one or multiple light receiving devices, the light transmitting section transmitting light of the light emitting device, the one or multiple light receiving devices receiving light reflected by a reflective layer of the light of the light emitting device exiting through the light transmitting section,
    a wiring substrate including a wiring line adapted to electrically coupling the coupling line and the circuit board, and
    an organic member provided in common to the optical sensors, the organic member preventing external light from entering the one or multiple light receiving devices and fixing the multiple optical sensors in series.

(14)

The optical sensor module according to (13), in which
  the optical sensors each further include
  the reflective layer, and
  a deformation layer that supports the reflective layer and is deformable by an external force and light transmissive.

(15)

The optical sensor module according to (14), in which
  the optical sensors each further include a light-transmissive substrate that supports the circuit board,
  the deformation layer is fixed to the light-transmissive substrate, and
  the organic member covers the reflective layer, the deformation layer, and the light-transmissive substrate.

(16)

The optical sensor module according to (14), in which
  the optical sensors each further include a light-transmissive substrate that supports the circuit board,
  the deformation layer is fixed to the organic member, and
  the organic member is configured to be attachable to and detachable from the light-transmissive substrate.

(17)

The optical sensor module according to any one of (13) to (16), further including:
  a control device coupled, via the coupling line, to a first optical sensor disposed at one end of the multiple optical sensors coupled in series, the control device controlling light emission of the light emitting device in each of the optical sensors; and
  an interface device coupled, via the coupling line, to a second optical sensor disposed at another end of the multiple optical sensors coupled in series, the interface device outputting, to an outside, a light reception signal obtained by the one or multiple light receiving devices of each of the optical sensors or a signal corresponding to the light reception signal.

(18)

The optical sensor module according to any one of (13) to (16), in which a gap between two the wiring substrates adjacent to each other is smaller than an arrangement pitch of the multiple optical sensors.

According to the optical sensor and the optical sensor module of the embodiments of the present disclosure, the light emitting substrate including the light emitting device and the circuit board including the one or multiple light receiving devices are stacked, and of the light of the light emitting device exiting through the light transmitting section, the light reflected by the reflective layer is received by the one or multiple light receiving devices. Accordingly, it is possible to dispose the multiple optical sensors at a high density. Note that the effects of the present disclosure are not necessarily limited to the effects described above and may be any of the effects described herein.

This application claims the priority on the basis of Japanese Patent Application No. 2019-197606 filed on Oct. 30, 2019 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An optical sensor comprising:
a light emitting substrate including a light emitting device;
a circuit board provided at a position opposing the light emitting device, the circuit board including a light transmitting section and one or multiple light receiving devices, the light transmitting section transmitting light of the light emitting device, the one or multiple light receiving devices receiving light reflected by a reflective layer of the light of the light emitting device exiting through the light transmitting section,
wherein the one or multiple light receiving devices are formed on a first major surface of the circuit board, and
the light emitting substrate is disposed at a position opposing a second major surface, of the circuit board, on an opposite side to the first major surface, and is stacked on the circuit board with a first bump interposed therebetween, and
wherein the circuit board further includes a control circuit and a processing circuit, the control circuit controlling light emission of the light emitting device, the processing circuit processing a light reception signal obtained by the one or multiple light receiving devices; and
a wiring substrate including a wiring line adapted to electrically coupling an external circuit and each of the control circuit and the processing circuit, the wiring substrate being disposed at a position opposing the circuit board with the light emitting substrate interposed therebetween and being stacked on the circuit board with a second bump interposed therebetween.

2. The optical sensor according to claim 1, wherein the light transmitting section is a through hole running through the circuit board.

3. The optical sensor according to claim 1, wherein the multiple light receiving devices are disposed around the light transmitting section.

4. The optical sensor according to claim 1, further comprising: the reflective layer;
a deformation layer that supports the reflective layer and is deformable by an external force and light transmissive; and
a light blocking section that prevents external light from entering the reflective layer and the one or multiple light receiving devices.

5. The optical sensor according to claim 4, further comprising
a light-transmissive substrate that supports the circuit board, wherein the deformation layer is fixed to the light-transmissive substrate, and
the light blocking section covers the reflective layer, the deformation layer, and the light-transmissive substrate.

6. The optical sensor according to claim 4, further comprising
a light-transmissive substrate that supports the circuit board, wherein the deformation layer is fixed to the light blocking section, and
the light blocking section is configured to be attachable to and detachable from the light-transmissive substrate.

7. The optical sensor according to claim 4, further comprising
a light-transmissive substrate that supports the circuit board, wherein
the light-transmissive substrate includes a half mirror layer on a surface on an opposite side to the circuit board, and
the multiple light receiving devices are disposed in a region in vicinity of the light transmitting section and a region away from the light transmitting section.

8. The optical sensor according to claim 4, wherein the reflective layer has regular protrusions and recesses on a reflective surface.

9. The optical sensor according to claim 1, wherein the processing circuit calculates a displacement of the reflective layer caused by an external force on a basis of the light reception signal and outputs it to an outside.

10. An optical sensor module comprising
multiple optical sensors coupled in series via a coupling line, the optical sensors each including
a light emitting substrate including a light emitting device,
a circuit board provided at a position opposing the light emitting device, the circuit board including a light transmitting section and one or multiple light receiving devices, the light transmitting section transmitting light of the light emitting device, the one or multiple light receiving devices receiving light reflected by a reflective layer of the light of the light emitting device exiting through the light transmitting section,
a wiring substrate including a wiring line adapted to electrically coupling the coupling line and the circuit board,
the one or multiple light receiving devices are formed on a first major surface of the circuit board,
the light emitting substrate is disposed at a position opposing a second major surface, of the circuit board, on an opposite side to the first major surface, and is stacked on the circuit board with a first bump interposed therebetween,
the circuit board further including a control circuit and a processing circuit, the control circuit controlling light emission of the light emitting device, the processing circuit processing a light reception signal obtained by the one or multiple light receiving devices,
the wiring substrate including the wiring line adapted to electrically coupling an external circuit and each of the control circuit and the processing circuit, the wiring substrate being disposed at a position opposing the circuit board with the light emitting substrate interposed therebetween and being stacked on the circuit board with a second bump interposed therebetween, and
an organic member provided in common to the optical sensors, the organic member preventing external light from entering the one or multiple light receiving devices and fixing the multiple optical sensors in series.

11. The optical sensor module according to claim 10, wherein the optical sensors each further include
the reflective layer, and a deformation layer that supports the reflective layer and is deformable by an external force and light transmissive.

12. The optical sensor module according to claim 11, wherein
the optical sensors each further include a light-transmissive substrate that supports the circuit board,
the deformation layer is fixed to the light-transmissive substrate, and
the organic member covers the reflective layer, the deformation layer, and the light-transmissive substrate.

13. The optical sensor module according to claim 11, wherein
the optical sensors each further include a light-transmissive substrate that supports the circuit board,
the deformation layer is fixed to the organic member, and
the organic member is configured to be attachable to and detachable from the light-transmissive substrate.

14. The optical sensor module according to claim 10, further comprising:
a control device coupled, via the coupling line, to a first optical sensor disposed at one end of the multiple optical sensors coupled in series, the control device controlling light emission of the light emitting device in each of the optical sensors; and
an interface device coupled, via the coupling line, to a second optical sensor disposed at another end of the multiple optical sensors coupled in series, the interface device outputting, to an outside, a light reception signal obtained by the one or multiple light receiving devices of each of the optical sensors or a signal corresponding to the light reception signal.

15. The optical sensor module according to claim 10, wherein a gap between two the wiring substrates adjacent to each other is smaller than an arrangement pitch of the multiple optical sensors.

16. An optical sensor comprising:
a light emitting substrate including a light emitting device;
a circuit board provided at a position opposing the light emitting device, the circuit board including a light transmitting section and one or multiple light receiving devices, the light transmitting section transmitting light of the light emitting device, the one or multiple light receiving devices receiving light reflected by a reflective layer of the light of the light emitting device exiting through the light transmitting section;
a deformation layer that supports the reflective layer and is deformable by an external force and light transmissive;
a light blocking section that prevents external light from entering the reflective layer and the one or multiple light receiving devices; and
a light-transmissive substrate that supports the circuit board, wherein
the light-transmissive substrate includes a half mirror layer on a surface on an opposite side to the circuit board, and
the multiple light receiving devices are disposed in a region in vicinity of the light transmitting section and a region away from the light transmitting section.

17. An optical sensor module comprising
multiple optical sensors coupled in series via a coupling line, the optical sensors each including
a light emitting substrate including a light emitting device,
a circuit board provided at a position opposing the light emitting device, the circuit board including a light transmitting section and one or multiple light receiving devices, the light transmitting section transmitting light of the light emitting device, the one or multiple light receiving devices receiving light reflected by a reflective layer of the light of the light emitting device exiting through the light transmitting section,
a deformation layer that supports the reflective layer and is deformable by an external force and light transmissive,
a light blocking section that prevents external light from entering the reflective layer and the one or multiple light receiving devices,
a light-transmissive substrate that supports the circuit board,
the light-transmissive substrate including a half mirror layer on a surface on an opposite side to the circuit board, and
the multiple light receiving devices are disposed in a region in vicinity of the light transmitting section and a region away from the light transmitting section,
a wiring substrate including a wiring line adapted to electrically coupling the coupling line and the circuit board, and
an organic member provided in common to the optical sensors, the organic member preventing external light from entering the one or multiple light receiving devices and fixing the multiple optical sensors in series.

* * * * *